United States Patent [19]

Inoue

[11] Patent Number: 5,276,639
[45] Date of Patent: Jan. 4, 1994

[54] SUPERCONDUCTOR MAGNETIC MEMORY CELL AND METHOD FOR ACCESSING THE SAME

[75] Inventor: Takashi Inoue, Tokyo, Japan

[73] Assignee: NEC Corporation, Tokyo, Japan

[21] Appl. No.: 687,006

[22] Filed: Apr. 18, 1991

[30] Foreign Application Priority Data

Apr. 18, 1990 [JP] Japan ................... 2-102438

[51] Int. Cl.$^5$ ............................. G11C 11/44
[52] U.S. Cl. ....................... 365/162; 365/160; 365/161; 257/31; 257/661; 505/702
[58] Field of Search ............ 257/661, 31, 32, 33, 257/34, 35; 365/160, 161, 162; 505/702

[56] References Cited

U.S. PATENT DOCUMENTS

| | | | |
|---|---|---|---|
| 3,543,237 | 2/1972 | Anacker | 365/162 |
| 3,626,391 | 12/1971 | Anacker | 365/162 |
| 3,705,393 | 12/1972 | Anacker et al. | 365/162 |
| 3,936,809 | 2/1976 | Zappe | 365/162 |
| 5,011,817 | 4/1991 | Hidaka et al. | 365/162 |
| 5,039,655 | 8/1991 | Pisharody | 365/161 |
| 5,039,656 | 8/1991 | Hidaka | 365/162 |
| 5,051,787 | 9/1991 | Hasegawa et al. | 365/162 |

FOREIGN PATENT DOCUMENTS 3-12092  1/1991  Japan .................. 365/162

OTHER PUBLICATIONS

Kinbara and Fujiwara, "Thin Film," *Applied Physics Series*, vol. 3, 1979, pp. 298-301.
Kump et al., "Coupled NDRO Magnetic Film Memory", IBM Tech. Dis. Bull., vol. 13, No. 7, Dec. 1990.
Archey et al., "Double layer memory device", IBM Tech. Dis. Bull., vol. 12, No. 7, Dec. 1969.

Primary Examiner—Rolf Hille
Assistant Examiner—Minhloan Tran
Attorney, Agent, or Firm—Burns, Doane, Swecker & Mathis

[57] ABSTRACT

A magnetic memory cell including an information storage unit of a three-layer structure having two magnetic thin films and a non-magnetic thin film interposed between the two thin films, an X-direction conductor and a Y-direction conductor intersecting each other at a position of the information storage unit, and a sense conductor located at a side of the X-direction conductor opposite to the Y-direction conductor. The sense conductor is separated from the X-direction conductor and extending to overlap the X-direction conductor. The two magnetic thin films have an equal saturation magnetic flux amount and an uniaxial magnetic anisotropy in the film plane, but are different from each other in either one of a magnetic anisotropy and a coercive force. The X-direction conductor, the Y-direction conductor and the sense conductor are formed of a superconductor material, and the sense conductor has a Josephson junction (superconduction weak link) positioned above the information storage unit.

4 Claims, 10 Drawing Sheets

FIGURE 1A

"0" STORED STATE

FIGURE 1B

"1" STORED STATE

SUPERCONDUCTOR MAGNETIC MEMORY CELL AND METHOD FOR ACCESSING THE SAME

BACKGROUND OF THE INVENTION

1. Field of the Invention

The present invention relates to a magnetic memory cell and a method for accessing the same, and more specifically to a magnetic memory cell used for constructing a voluntarily writable/readable nonvolatile random access memory, and a method for accessing the memory.

2. Description of Related Art

In the prior art, a nondestructive memory composed of a pair of magnetic thin films was proposed. In brief, two magnetic films having different coercive forces are stacked with a non-magnetic insulating film interposed between the two sheets of magnetic films. The film having a large coercive force is used for holding one item of information, and the film having a small coercive force is used only for a reading of the stored information. The two magnetic films are magnetostatically coupled to each other, so that a magnetization of the read only magnetic film is controlled by a magnetic field produced by the information holding magnetic film.

Figure 1A:
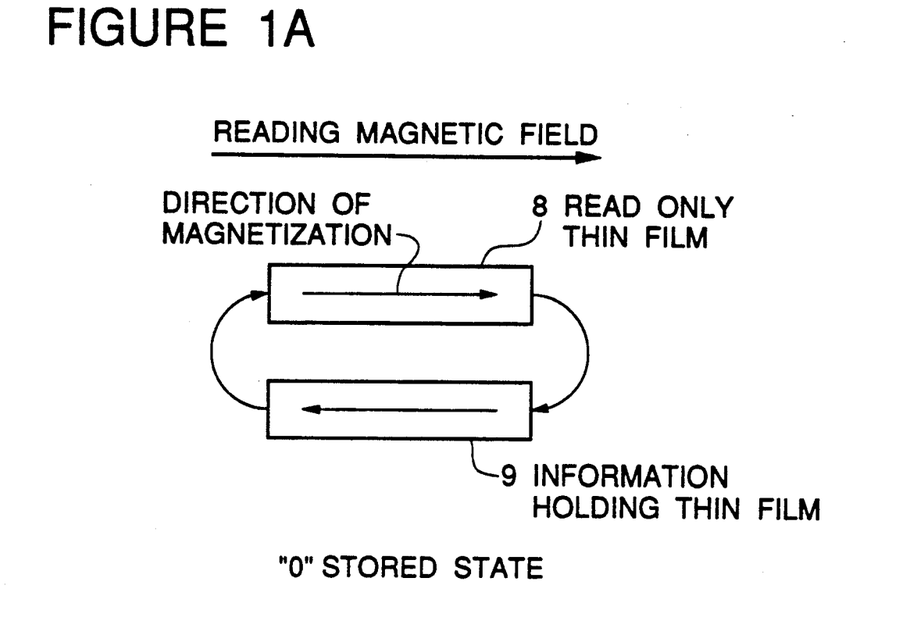
FIGS. 1A and 1B illustrate a principle of a nondestructive memory composed of two magnetic films.
Figure 1B:
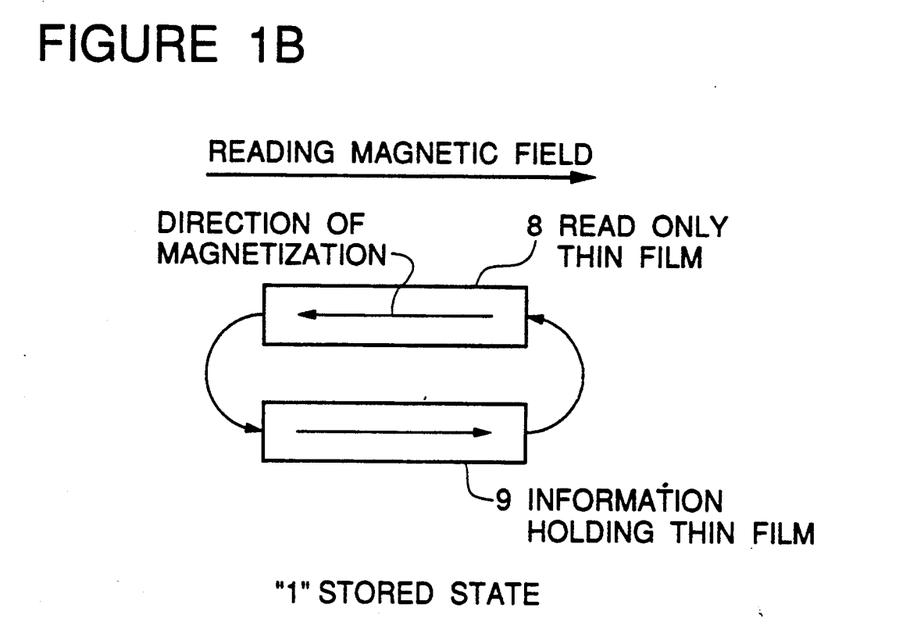

Referring to FIGS. 1A and 1B, two different conditions of a magnetic coupling between the information holding magnetic film and the read only magnetic film are diagrammatically illustrated. The two conditions of a magnetic coupling are distinguished from each other by a direction of magnetization. FIG. 1A shows a "0" storage condition, and FIG. 1B shows a "1" storage condition. The non-magnetic insulating film is omitted in the figure.

It is assumed that a reading magnetic field is applied in a direction from left to right in the figure. In this case, a reading voltage from the "0" storage condition is "0". On the other hand, when the "1" storage condition is read out, an output voltage due to a magnetization reversal of the read only film is detected. If the reading magnetic field disappears, the magnetization of the read only magnetic film is returned to an original condition, and the stored information is held. In the case of writing information, a magnetic field larger than the coercive force of the information holding magnetic film is applied so as to change the condition of the memory cell.

The above mentioned memory cell is of a nonvolatile and nondestructive type. With microminiaturization of a cell size for increasing a recording density and an integration density, a detection sensibility of a magnetic stored information is inevitably lowered, and an electric power consumption due to a control current is increased. As a result, the increase of the reading density has been limited on the order of 1Mbits/cm$^2$. A mechanism of magnetization rotation in the magnetic material is based on displacement of a magnetic domain wall. Therefore, an access speed is on the order of microseconds to milliseconds, and is less than one-hundredth of that of a semiconductor memory.

SUMMARY OF THE INVENTION

Accordingly, it is an object of the present invention to provide a novel magnetic memory cell which has overcome the above mentioned defect of the conventional one, and a method for accessing the novel magnetic memory cell.

Another object of the present invention is to provide a magnetic memory cell enabling a high access speed, a high recording density and a high integration density.

The above and other objects of the present invention are achieved in accordance with the present invention by a magnetic memory cell including an information storage unit of a three-layer structure having two magnetic thin films and a non-magnetic thin film interposed between the two thin films, an X-direction conductor and a Y-direction conductor intersecting each other at a position of the information storage unit, a sense conductor located at a side of the X-direction conductor opposite to the Y-direction conductor, the sense conductor being separated from the X-direction conductor and extending to overlap the X-direction conductor, the two magnetic thin films having an equal saturation magnetic flux amount and an uniaxial magnetic anisotropy in the film plane, but being different from each other in either one of a magnetic anisotropy and a coercive force, the X-direction conductor, the Y-direction conductor and the sense conductor being formed of a superconductor material, and the sense conductor having a Josephson junction positioned above the information storage unit.

The above mentioned magnetic memory cell can be read and written by applying a controlled magnetic field as follows: Since the magnetic thin films have the uniaxial magnetic anisotropy, the magnetic thin films have a magnetization ease direction and a magnetization hard direction. When a magnetic field is applied, an magnetic field is applied in the magnetization hard direction from a predetermined time before application of a magnetic field in the magnetization ease direction. On the other hand, when a magnetic field is erased, a magnetic field in the magnetization hard direction continues to be applied for a predetermined period of time after a magnetic field in the magnetization ease direction has been erased.

In addition, the magnetic thin films can be formed of a collection or array of magnetic pieces having a size not greater than a thickness of a magnetic domain wall (on the order of several thousands angstroms)

In the magnetic memory cell in accordance with the present invention, magnetization of the magnetic member is reversed by utilizing an operating region in which a reversal mechanism is based on a spin simultaneous rotation mode of the magnetization. In this specification, in view of analogy with technical terms used in the case in which the rotation of magnetization is based on displacement of a magnetic domain wall, a magnetic member in which the spin simultaneous rotation mode of the magnetization is ease, is called a "soft simultaneous rotation magnetic member", and a magnetic member in which the spin simultaneous rotation mode of the magnetization is hard, is called a "hard simultaneous rotation magnetic member".

As seen from the above, it can be said that the information storage unit of the three-layer structure is formed of the soft simultaneous rotation magnetic member and the hard simultaneous rotation magnetic member which have an uniaxial magnetic anisotropy in their film plane and the same saturation magnetic flux amount and which are stacked on each other by interposing the thin non-magnetic film between the soft simultaneous rotation magnetic member and the hard simultaneous rotation magnetic member. In a condition of holding the stored information, a strong magnetostatic coupling is formed between the two magnetic members, and therefore, there is no magnetic field leaked from the memory cell to an external. In other words, the two magnetic member forms a quasi-closed magnetic circuit structure. Therefore, a demagnetizing field effect and a creep phenomenon of magnetic domain wall can be prevented, and also, magnetic interference between magnetic memory cells can be suppressed.

In the magnetic memory cell in accordance with the present invention, a magnetically stored information is detected with good sensibility by means of the Josephson junction (superconduction weak link) very sensible to a magnetic field. Therefore, the magnetic information storage unit and hence the memory cell can be microminiaturized.

A strength of magnetization, namely a saturated magnetic flux density Ms in usually used magnets is on the order of 0.5 T (=0.5 Wb/m$^2$) or less. Here, assume that this magnet is patterned to have a size of 2 $\mu$m×2 $\mu$m×0.2 $\mu$m which is a size of a typical fine thin film structure that can be found in current integrated circuits, and a section of 2 $\mu$m×0.2 $\mu$m forms a magnetic pole from which a magnetic flux projects. The amount of this flux can be expressed as follows:

$$0.5(Wb/m^2) \times 2 \times 10^{-6}(m) \times 0.2 \times 10^{-6}(m) = 2.0 \times 10^{-13}(Wb) \quad (1)$$

On the other hand, one fluxoid quantum unit $\Phi$o is $2.0 \times 10^{-15}$(Wb). Therefore, the amount of the magnetic flux generated by the magnetic pole, namely, the magnetic member is about 100 $\Phi$o.

One Josephson junction can be switched over by one fluxoid quantum $\Phi$o, as seen from a known Fraunhofer diffraction pattern of a current (I)—magnetic flux ($\Phi$). In the magnetic memory cell in accordance with the present invention, therefore, the magnetic field emanating from the magnetic member can be sufficiently sensed by the Josephson junction.

In this connection, it might be feared that if a junction having a size smaller than a Josephson penetration length $\lambda_J$, a magnetic field hardly penetrates the junction. However, the magnetic field can sufficiently penetrate a junction which is formed by an ordinary fine patterning technology. In a junction having a size of 2 $\mu$m square, a penetration length $\lambda$ of a magnetic flux reaches several thousands angstroms. In view of this, an area S in an edge portion of the junction to which the magnetic flux penetrates can be estimated to be S=2 $\mu$m×0.2 $\mu$m. Therefore, a magnetic flux density B required for penetration of one fluxoid quantum $\Phi$o can be as small as $5.0 \times 10^{-3}$(Wb/m$^2$)=50 (Gauss), since $\Phi$o=BS.

Since the X-direction conductor, the Y-direction conductor and the sense conductor are formed of a superconductor material, even if the cell is microminiaturized, a wiring resistance of these conductors can be maintained at a sufficiently small value. In addition, it is not necessary to provide a back-up voltage supply in a standby condition. Therefore, a nonvolatile memory can be obtained. Furthermore, as mentioned above the stored information can be detected with high sensibility. Therefore, a consumed electric power can be greatly reduced.

In the method of accessing the magnetic memory cell in accordance with the present invention, when a controlled magnetic field is applied to the magnetic thin films in order to read and write the magnetic memory cell, both the magnetic field of the magnetization ease direction and the magnetic field of the magnetization hard direction can be utilized as follows: When a magnetic field is applied, the magnetic field of the magnetization hard direction is applied from a predetermined time before application of the magnetic field is erased, the magnetic field of the magnetization hard direction continues to be applied for a predetermined period of time after the magnetic field of the magnetization ease direction has been erased. As a result, an operating region of the magnetic member in which the magnetization rotation mechanism becomes the spin simultaneous rotation mode is enlarged.

The magnetic memory cell in accordance with the present invention utilizes the operation region of the spin simultaneous rotation mode, the access speed becomes on the order of several tens nanoseconds, which are remarkably higher than that in the conventional example.

The magnetic sense section can be formed of a Josephson SNS (superconductor/normal conductor/superconductor) junction which utilizes a superconductor close effect, not a Josephson SIS (superconductor/insulator/superconductor) tunnel junction. Therefore, a high temperature oxide superconductor having an extremely short coherence length of electron wave can be used to form the X-direction conductor, the Y-direction conductor and the sense conductor. In other words, the memory cell can be operated at a high temperature (liquid nitrogen temperature 77K).

The performance of the magnetic thin film memory can be greatly improved by the above mentioned five features of the present invention.

As mentioned hereinbefore, in the magnetic memory cell in accordance with the present invention, the magnetic thin films can be formed of a collection or array of magnetic pieces having a size not greater than a thickness of a magnetic domain wall (ordinarily, on the order of several thousands angstroms). For example, the magnetic thin films is equally divided into minute magnetic members having a size of 1000 Å square or less. In the minute magnetic members having the size not greater than the thickness of the magnetic domain wall, the magnetization of the magnetic member can easily assume a unitary magnetic domain under an effect of the size and the shape. Therefore, the magnetization rotation mechanism can be mainly constituted of the spin simultaneous rotation. Accordingly, the operating region in which the magnetization rotation mechanism is in the spin simultaneous rotation mode is further enlarged.

The above and other objects, features and advantages of the present invention will be apparent from the following description of preferred embodiments of the invention with reference to the accompanying drawings.

DESCRIPTION OF THE PREFERRED EMBODIMENTS

Figure 2:
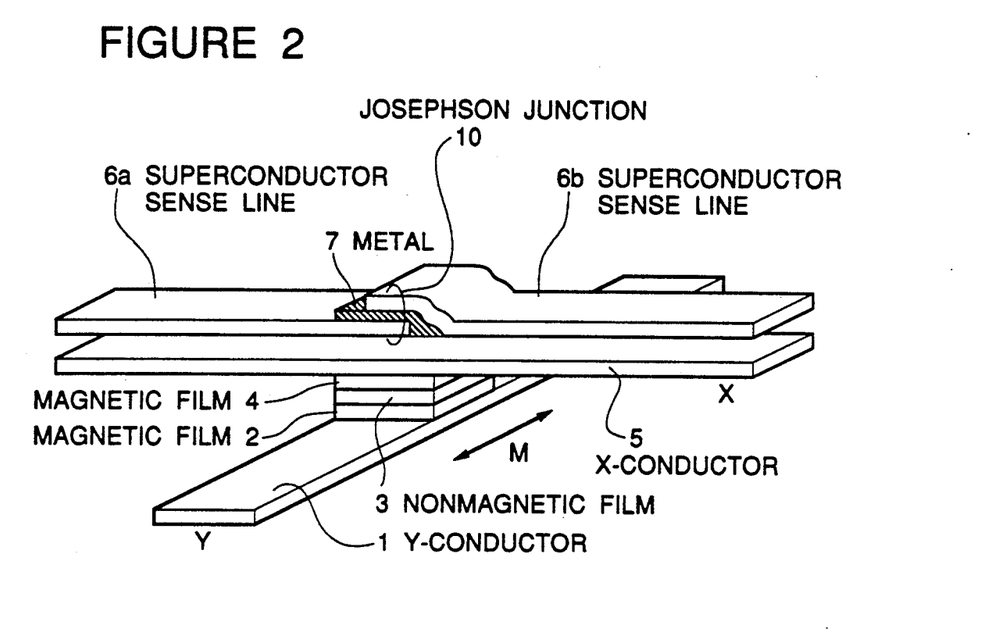
FIG. 2 is a diagrammatic perspective view of one embodiment of the magnetic memory cell in accordance with the present invention.

Referring to FIG. 2, there is shown a diagrammatic perspective view of one embodiment of the magnetic memory cell in accordance with the present invention.

A superconductor ground layer (not shown) is formed on a substrate (not shown), and an insulating layer (not shown) of for example $SiO_2$ is formed on the superconductor ground layer. A superconductor ground layer is further formed on the insulating layer (not shown) and patterned to a Y-direction conductor 1 in the form of a line extending in a Y direction. The Y-direction conductor 1 has a width of 2 $\mu$m and a thickness of 2000 Å to 3000 Å.

On the patterned Y-direction conductor 1 and the insulating layer (not shown), a first magnetic thin film 2, a non-magnetic thin film 3 and a second magnetic thin film 4 are deposited in the named order, and then, patterned to have a square three-layer structure as shown. Each of the first magnetic thin film 2 and the second magnetic thin film 4 is as thin as 500 Å, and on the other hand, the non-magnetic thin film 3 is as relatively thick as 1000 Å in order to prevent an indirect magnetic coupling between the upper and lower magnetic thin films due to an exchange interaction.

Thereafter, a convex and concave surface of the substrate is planarized by an etch-back planarization process or other suitable process. On the thus planarized upper surface of the substrate, another superconductor layer is deposited, and patterned to an X-direction conductor 5 in the form of a line extending in an X direction so as to pass on the three-layer structure formed of the first magnetic thin film 2, the non-magnetic thin film 3 and the second magnetic thin film 4. A width and a thickness of the X-direction conductor 5 are the same as those of the Y-direction conductor 1.

Furthermore, another insulating layer (not shown) of for example $SiO_2$ is deposited, and then, a further superconductor layer is formed on the insulating layer and patterned to form a superconductor sense line 6a in the form of a line extending from a position above the three-layer structure to overlay the X-direction conductor 5. A metal layer 7 such as gold is deposited and patterned to a predetermined shape lying only on a portion above the three-layer structure, as shown in the drawing. The large the Fermi velocity of electrons is, the much the metal is desired.

Then, a still further superconductor layer is formed and patterned to form a superconductor sense line 6b in the form of a line extending from the patterned metal layer 7 to overlay the X-direction conductor 5 in a direction opposite to the extending direction of the superconductor sense line 6a.

Figure 3:
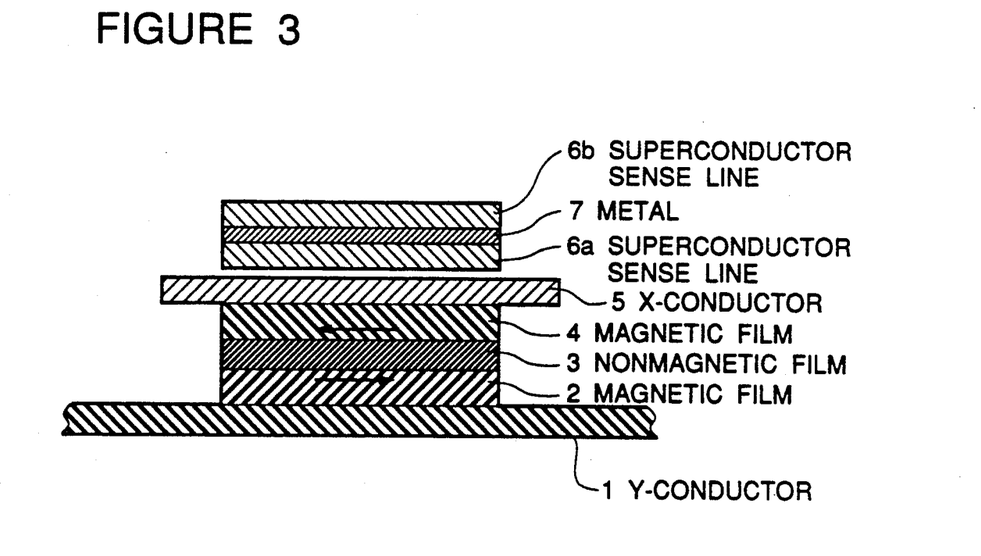
FIG. 3 is a diagrammatic sectional view of the magnetic memory cell shown in FIG. 2 viewed in an X-direction.

Thus, above the three-layer structure, a Josephson junction (superconductor weak link) 10 is formed in a gap between the superconductor sense lines 6a and 6b. Incidentally, the sectional view of the FIG. 3 is a view observed from the X-direction. In the sectional views of FIGS. 6 and the succeeding figures, the superconductor sense lines 6a and 6b and the sandwiched metal layer 7 as well as the Josephson junction are shown by one hatched block given with Reference Numeral 10, for simplification of the drawings.

A thickness of the superconductor ground layer (not show) is on the order of 1.0 $\mu$m to 1.2 $\mu$m, which is larger than an ordinary Josephson device, for the purpose of preventing the magnetic flux from being trapped in the superconductor ground layer.

In addition, the first and second magnetic thin films 2 and 4 are deposited by applying different magnetic fields in the course of respective deposition processes, or by maintaining the substrate temperature at different temperatures.n the course of respective deposition processes, so that the first and second magnetic thin films 2 and 4 have induced magnetic anisotropy of different strengths. More specifically, the first magnetic thin film 2 becomes the hard simultaneous rotating magnetic member having a high simultaneous rotating magnetic field, and the second magnetic thin film 4 becomes the soft simultaneous rotating magnetic member having a low simultaneous rotating magnetic field. In FIG. 2, the magnetization ease direction is in the Y direction, and indicated by Reference Sign "M".

In addition, the first and second magnetic films 2 and 4 have the same saturated magnetic flux amount, so that, in a magnetization stabilized condition in which the first and second magnetic films 2 and 4 are completely magnetostatically coupled, a leakage of magnetic flux from the the first and second magnetic films 2 and 4 is suppressed to a possible minimum level.

Figure 5:
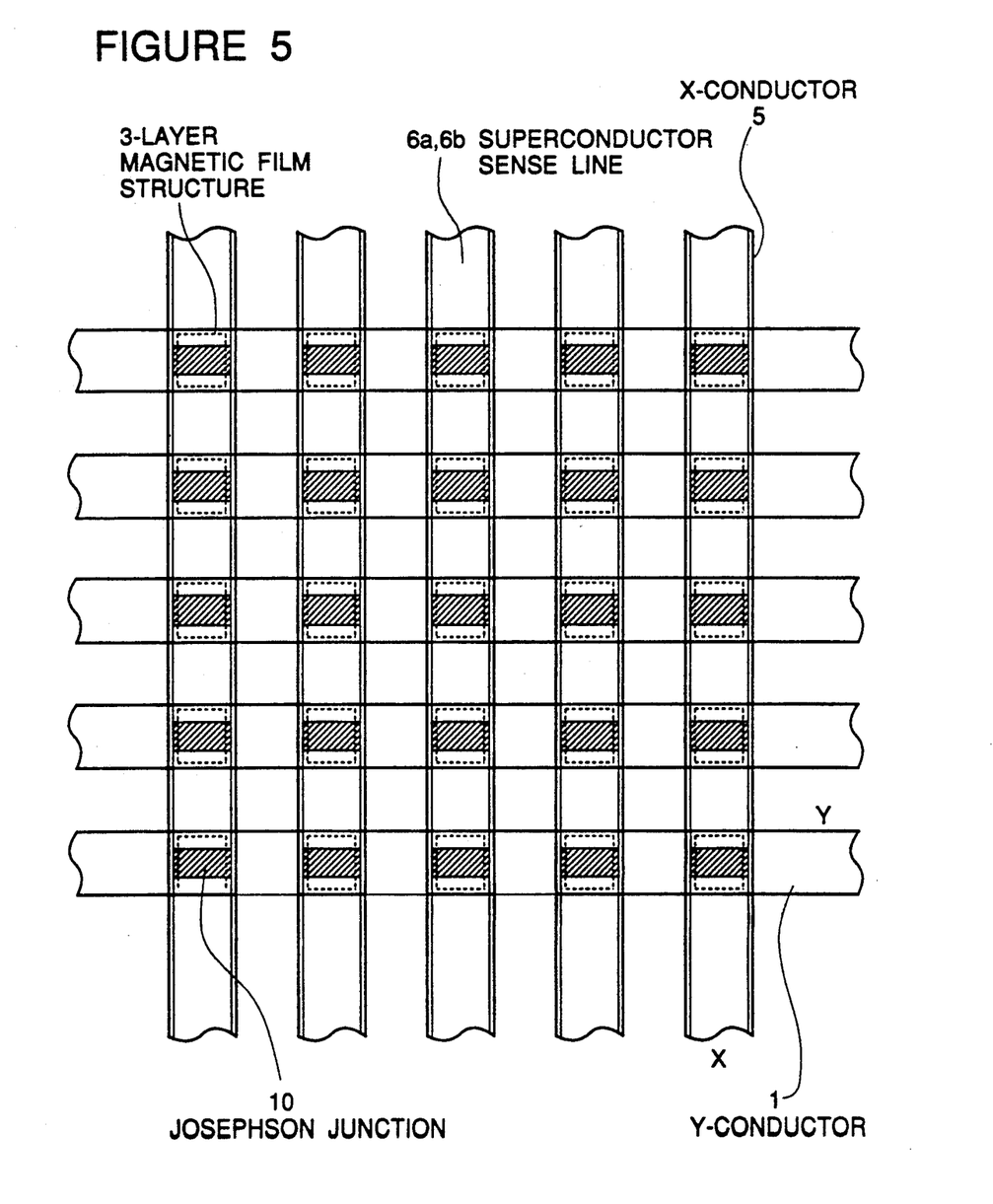
FIG. 5 illustrates a matrix array of memory cells.

A memory device can be formed of a memory section including a number of memory cells, each of which consists of the above mentioned memory cell, arranged in the form of a matrix as shown in FIG. 5, and a peripheral control circuit section located at a periphery of the memory section and including for example a decoder and a driver for controlling the writing/reading.

In principle, the X-direction conductor 5, the Y-direction conductor 1 and the sensing lines 6a and 6b, and superconductor wirings in the peripheral control circuit section can be formed of any superconductor material. However, it is desired that the device can operate at a high temperature such as a liquid nitrogen temperature of 77K. Therefore, a recently highlighted oxide type high temperature superconductor material such as YBCO superconductor material is preferred.

Conventionally, when a magnetic sensor and a logic circuit have been formed of superconductor, a Josephson SIS tunnel junction has been utilized. However, all oxide type high temperature superconductor materials discovered to now are short in a coherent length of electron wave. Therefore, it is very difficult to form a tunnel junction having an excellent characteristics by using the oxide type high temperature superconductor materials, since an extremely fine structure (on the order of angstroms) must be formed with a high degree of precision, and since it is difficult to control a physical property and a structure in proximity of a junction boundary.

In this embodiment, the SNS Josephson junction (superconductor weak link) utilizing the superconductor close effect is formed in place of Josephson SIS tunnel junction. In this SNS structure, Cooper pairs permeates from the superconductor into a normal conductor (such as a normal conductor metal and a semiconductor) forming the weak link. The coherence length of the Cooper pair electron wave in the superconductor weak link portion (corresponding to an insulator tunnel barrier portion in the SIS tunnel junction) is not determined by the superconductor, but is determined by the coherence length of the Cooper pair electron wave in the normal conductor forming the weak link portion. This coherence length reaches several hundreds angstroms to several thousands angstroms at a low temperature. Therefore, the SNS Josephson junction is free of severe restrictions for the fine patterning and etching process required for forming the device, and accordingly, can be formed relatively easily.

In place of the Josephson SNS junction, it is considered to use a grain boundary Josephson junction. Specifically, the superconductor sense lines $6a$ and $6b$ are replaced by a signal superconductor sense line similar to the X-direction conductor 5 and the Y-direction conductor 1, and ions are implanted into only a portion of signal superconductor sense line where a superconductor weak link is to be formed. This method is advantageous in that the structure is simple and therefore fine patterning and etching process is not necessary. In addition, it is possible to simply form a magnetic field sensible portion in an oxide type high temperature superconductor having an extremely short coherence length of electron wave.

The magnetic material is required to have such a characteristics that both of the hard simultaneous rotation magnetic member and the soft simultaneous rotation magnetic member have a uniaxial magnetic anisotropy and a relatively low coercive force and that the saturated magnetic flux density can be changed over a wide range from a relatively low level to a relatively high level. Specifically, a garnet type ferrite such as a YIG (yttrium-iron-garnet) ferrite which is insulative and is easy to control the saturated magnetic flux density. Alternatively, it is possible to use an amorphous metal CoZr having induced magnetic anisotropy.

Figure 6:
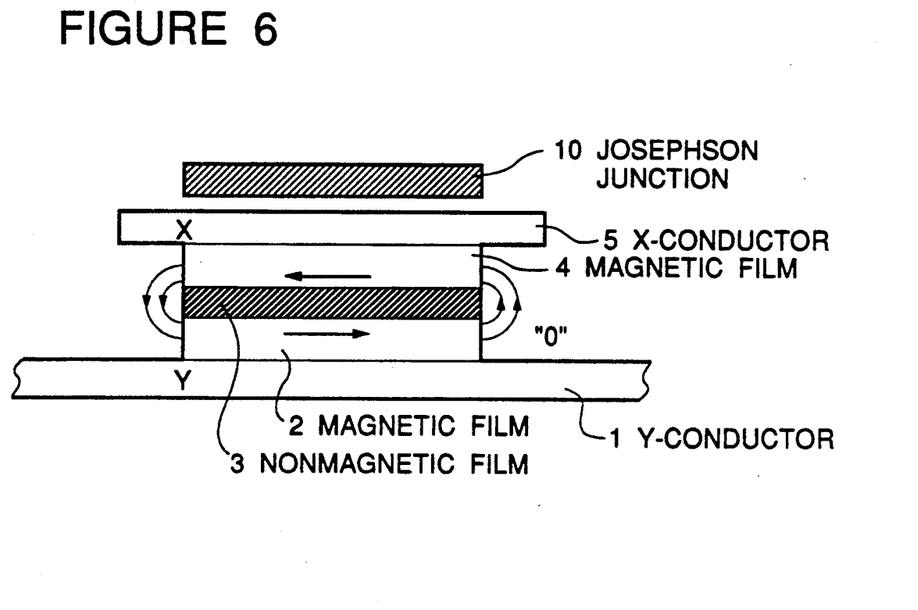
FIGS. 6 and 7 are diagrammatic sectional views of the memory cell for illustrating two magnetized conditions corresponding to stored items of information "0" and "1", respectively.
Figure 7:
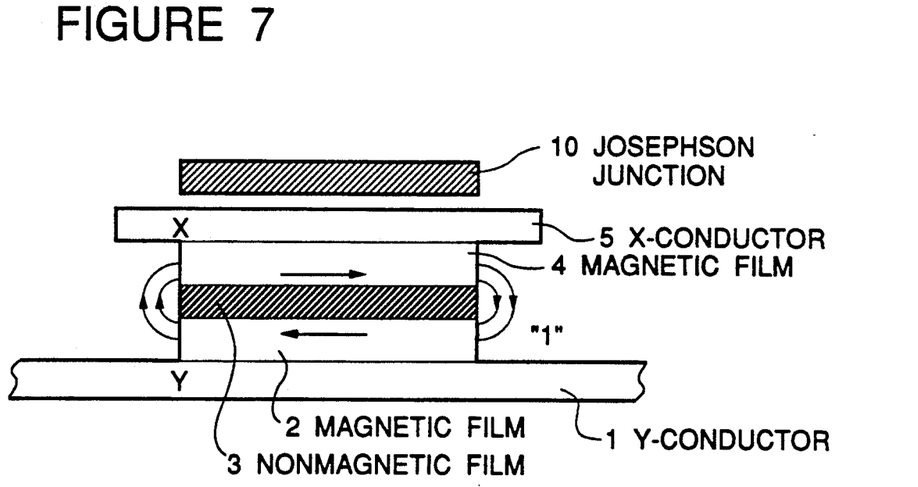

In the shown embodiment, the direction of the stabilized magnetization of the hard simultaneous rotation magnetic member 2 is controlled dependently upon the stored information "0" or "1", by applying electric currents to the X-direction conductor 5, the Y-direction conductor 1 and the sense line 6 ($6a$ and $6b$). FIG. 6 shows a magnetized condition of the magnetic member corresponding to the stored information "0", and FIG. 7 shows a magnetized condition of the magnetic member corresponding to the stored information "1". Selection of the memory cell and access to the selected memory cell are carried out by setting application timing and magnitude of control currents supplied to the X-direction conductor 5 and the Y-direction conductor 1. Specific values can be set in a current coincidence system by utilizing a method of an asteriod curve concerning a static magnetization switching process of a Stoner & Wohlfarth magnetic thin film using a magnetization simultaneous rotation model (Kinbara and Fujiwara, Applied Physics Series, Vol. 3 "Thin Film", 1979). In the shown magnetic memory cell, as mentioned hereinbefore, when the magnetization of the magnetic member is reversed, the operating region in which the magnetization reversal mechanism is a spin simultaneous rotation mode is used.

Now, a basic mechanism for accessing a selected memory cell will be described: Semi-selected cells arranged on one selected X-direction conductor are subjected to no magnetic field of the magnetization hard direction by the Y-direction conductors 1, but only a magnetic field of the magnetization ease direction by the selected X-direction conductor 5 supplied with an electric current. In this case, a spin dynamics of the magnetization reversal is based on the magnetic domain wall displacement, not by the spin simultaneous rotation. Therefore, the magnetization rotation speed in the semi-selected cells is 100 times or more slower than the magnetization rotation speed in the selected cell. Thereafter, the magnetization of the semi-selected cells almost never rotates within an actual access operating time period.

The writing operation will be described with reference to FIGS. 8, 9A, 9B and 9C.

Figure 8:
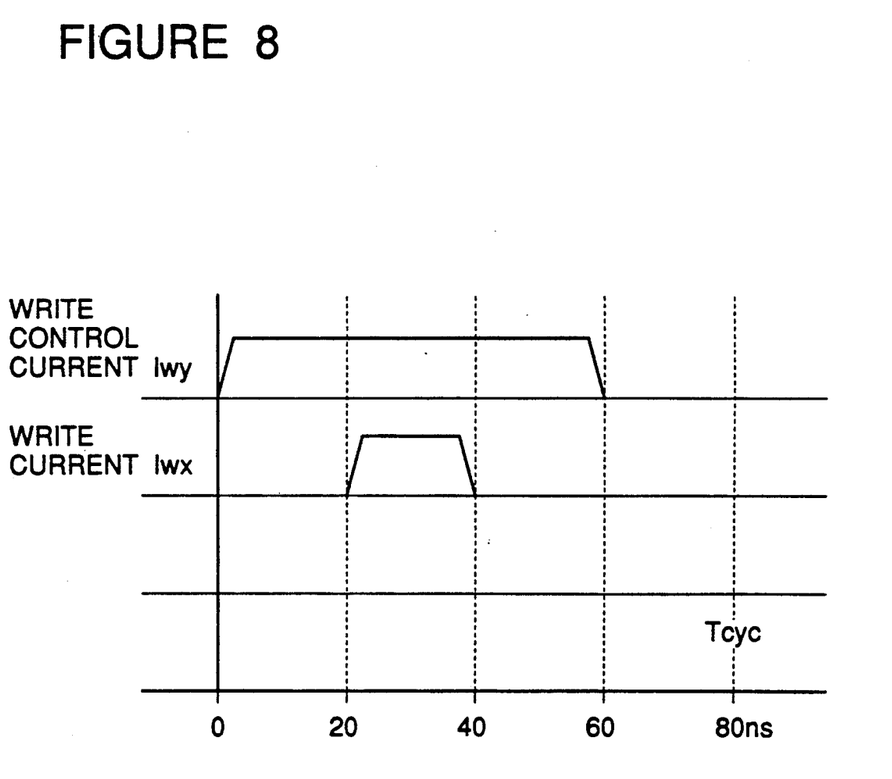
FIG. 8 is a timing chart illustrating timings of control currents for writing the memory cell.

First, as shown in the timing chart of FIG. 8, an electric current Iwy is supplied to a selected Y-direction conductor 1 (at the timing of Ons), so that the magnetization of the hard simultaneous rotation magnetic member 2 is inclined toward the magnetization hard direction by a current magnetic field Hwy generated by the current Iwy flowing through the selected Y-direction conductor 1.

Thereafter, or at the time of 20 ns in the timing chart of FIG. 8, an electric current Iwx is supplied to a selected X-direction conductor 5 from a "+" (positive) direction or a "−" (minus) direction selected dependently upon information "1" or "0" to be written. Namely, a writing current Iwx can be applied bidirectionally or in bipolarity.

Figure 9A:
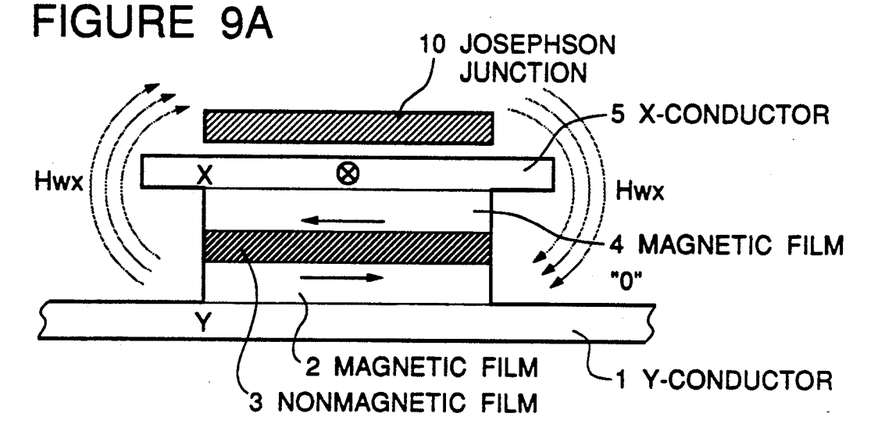
FIGS. 9A, 9B and 9C are diagrammatic sectional views of the memory cell for illustrating a sequence of writing the memory cell.
Figure 9B:
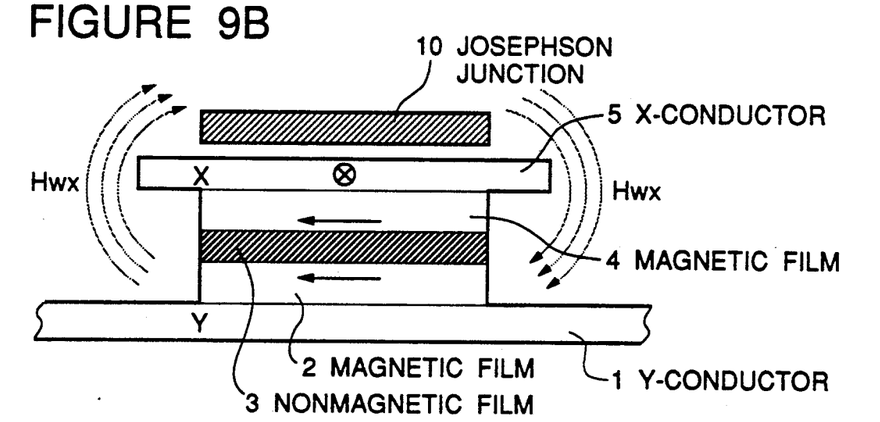
Figure 9C:
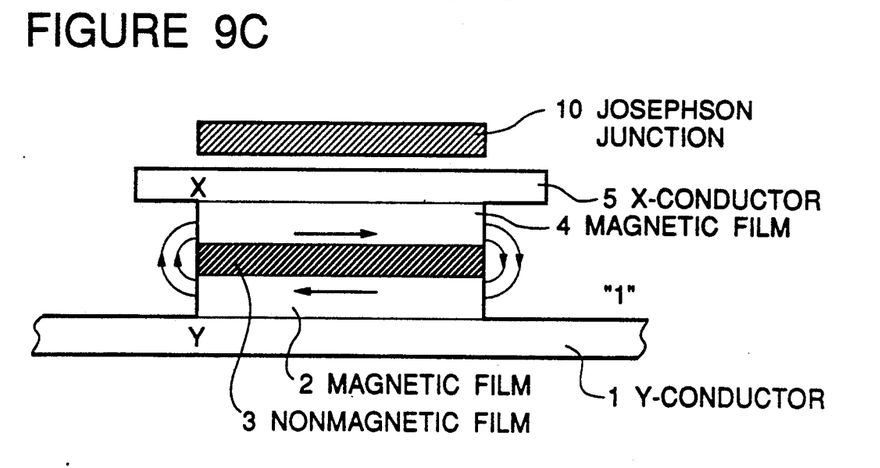

The case in which the information "1" is over-written to the memory cell holding the information "0" will be explained with reference to FIGS. 9A, 9B and 9C. FIG. 9A shows a condition at the moment that the electric current Iwx starts to be supplied to a selected X-direction conductor 5. Therefore, a current magnetic field Hwx is generated by the current Iwx, but, the magnetization of the hard simultaneous rotation magnetic member 2 has not yet been reversed. However, the magnetization of the hard simultaneous rotation magnetic member 2 is ultimately reversed as shown in FIG. 9B, by action of the current magnetic field Hwx generated by the current Iwx. In this connection, if the memory cell had held the information "1", the magnetization of the hard simultaneous rotation magnetic member 2 is maintained but the magnetization of the soft simultaneous rotation magnetic member 4 is reversed.

Thereafter, or at the timing of 40 ns in the timing chart of FIG. 8, only the current Iwx is turned off while maintaining the current Iwy. This condition is maintained during a predetermined period of time, namely, during a period of 20 ns from the turn-off of the current Iwx to the turn-off of the current Iwy in the timing chart of FIG. 8. During this period of time, the direction of the magnetization in the soft simultaneous rotation magnetic member 4 is reversed to the direction opposite to that of the magnetization in the hard simultaneous rotation magnetic member 2, by action of the strong magnetostatic coupling force between the soft simultaneous rotation magnetic member 4 and the hard simultaneous rotation magnetic member 2. Thus, the magnetic condition is stabilized to the effect that a magnetic flux passing through the magnetic members 2 and 4 forms a closed loop (quasi-closed magnetic circuit), as shown in FIG. 9C.

Accordingly, adverse phenomena disturbing a proper operation of the memory device, for example, the demagnetizing field effect and the creep of magnetic domain wall can be effectively prevented, and therefore, the stored information is very stably maintained. Namely, the stored information is held by the hard simultaneous rotation magnetic member 4. When the stored information is held by the hard simultaneous rotation magnetic member 4, the soft simultaneous rotation magnetic member 2 acts as a flux keeper for the hard simultaneous rotation magnetic member 4.

In the timing chart of FIG. 8, the cycle time (Tcyc) is set to 80 ns. However, since most of a period of time of 20 ns after the turn-off of the current Iwy is an operation margin, the cycle time (Tcyc) can be shortened to some extent.

The reading operation will be described with reference to FIGS. 10, 11A, 11B, 11C, 12A, 12B and 13C.

In principle, a relatively small bias pulse current Ib is applied to the sense line 6, and the stored information of "0" or "1" is read out by discriminating whether or not a potential difference occurs between opposite ends of the sense line 6.

Figure 10:
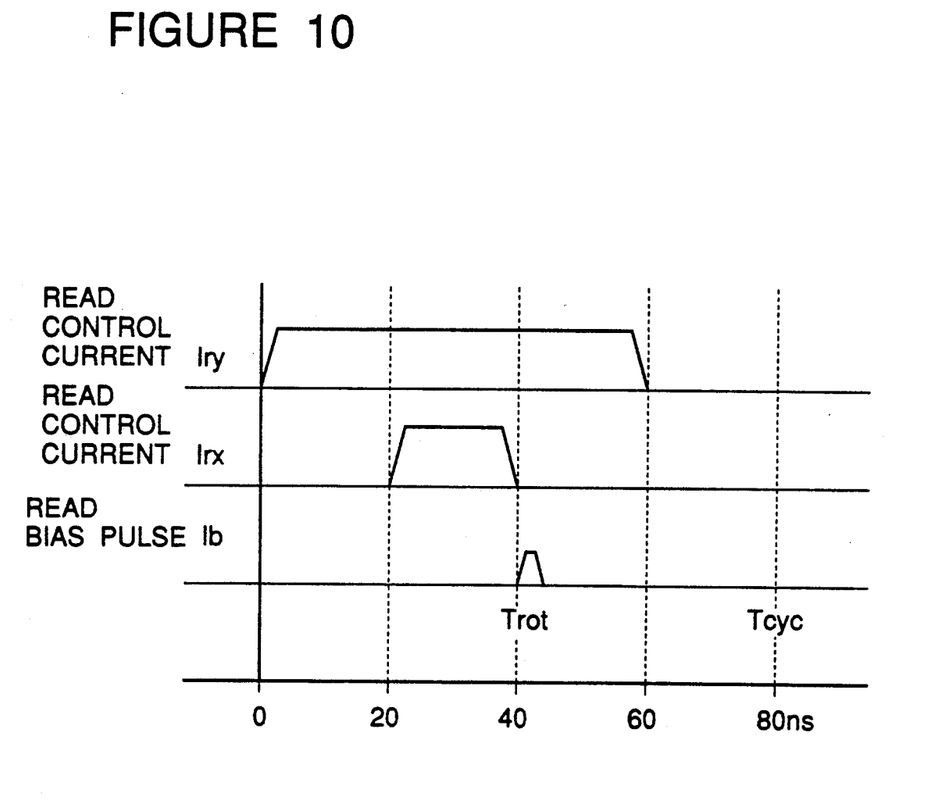
FIG. 10 is a timing chart illustrating timings of control currents and a timing current for reading the memory cell.

As shown in the timing chart of FIG. 10, a control current Iry is applied to a selected Y-direction conductor 1 so that the magnetization of the soft simultaneous rotation magnetic member 4 is inclined to the magnetization hard direction by a current magnetic field Hry generated the control current Iry.

Thereafter, a control current Irx is applied to the selected X-direction conductor 5 from a single predetermined direction. The control current Irx is set so that the magnetization of the soft simultaneous rotation magnetic member 4 can be reversed by a current magnetic field Hrx generated by the control current Irx, but the magnetization of the hard simultaneous rotation magnetic member 2 cannot be reversed by the current magnetic field Hrx generated by the control current Irx.

Dependently upon whether the stored information is "0" or "1", the the magnetization of the soft simultaneous rotation magnetic member 4 is or is not reversed by the current magnetic field Hrx. Here, assume that when the stored information is "1" (in FIG. 11A), the magnetization of the soft simultaneous rotation magnetic member 4 is reversed and when the stored information is "0" (in FIG. 12A), the magnetization of the soft simultaneous rotation magnetic member 4 is maintained.

Figure 11A:
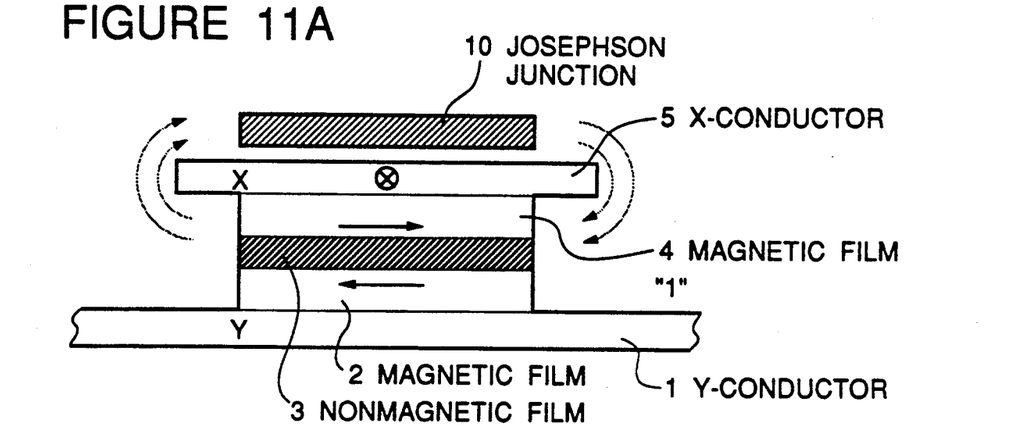
FIGS. 11A, 11B and 11C are diagrammatic sectional views of the memory cell for illustrating a sequence of reading the memory cell in the case that the stored information is "1"
Figure 11B:
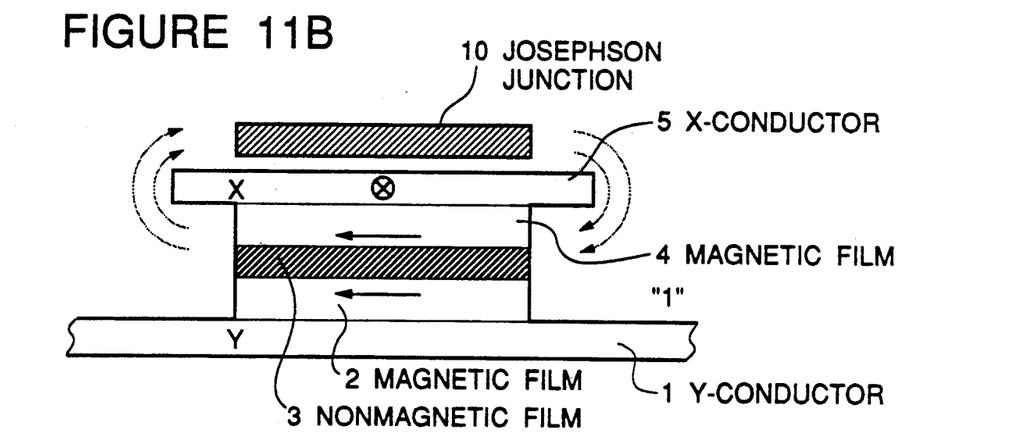
Figure 11C:
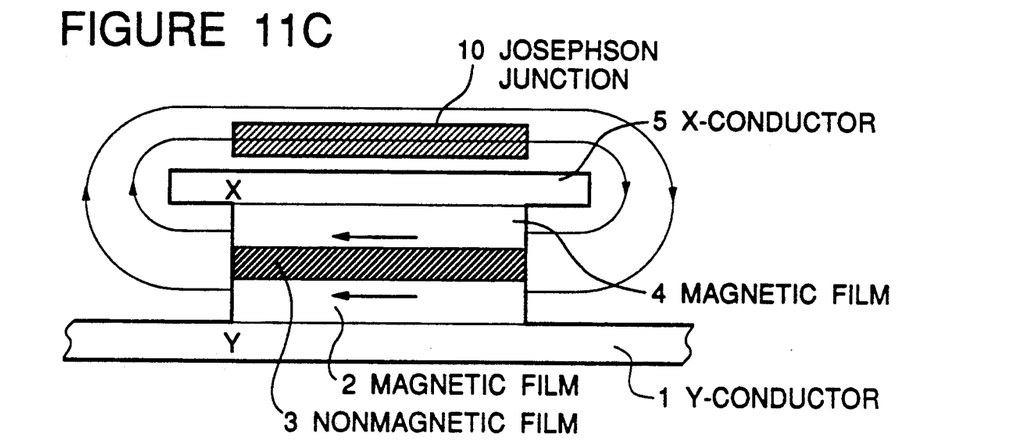
Figure 12A:
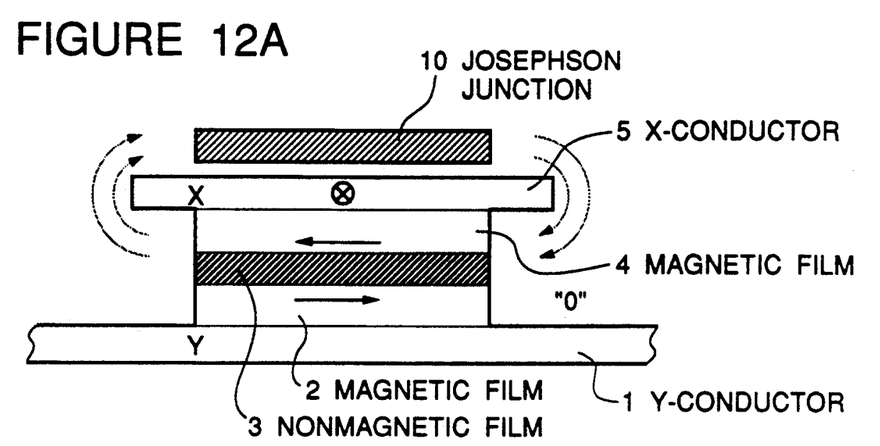
FIGS. 12A, 12B and 12C are diagrammatic sectional views of the memory cell for illustrating a sequence of reading the memory cell in the case that the stored information is "0".
Figure 12B:
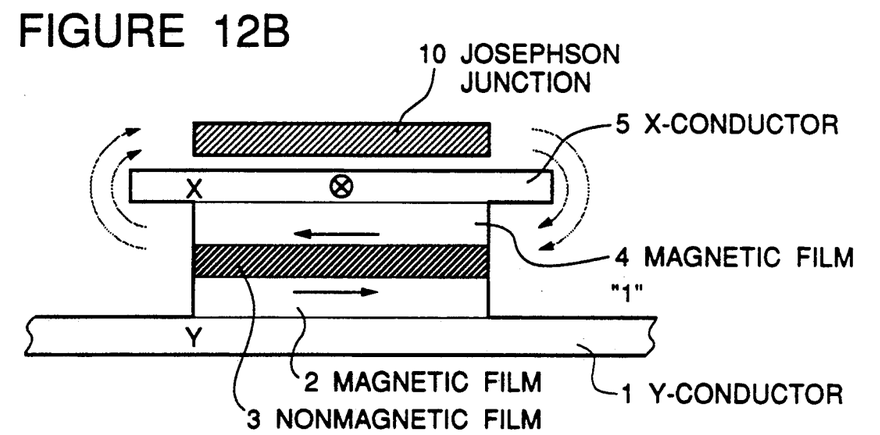
Figure 12C:
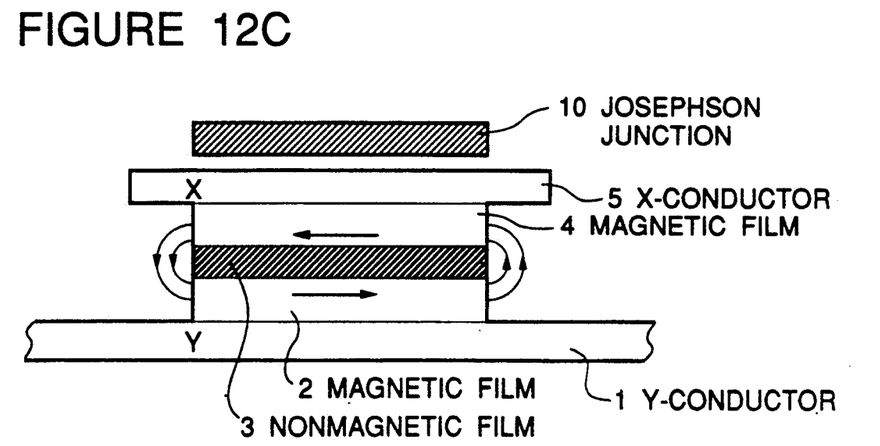

First, the operation when the stored information is "1" will be explained with reference to FIGS. 11A, 11B and 11C.

When reversal of the magnetization of the soft simultaneous rotation magnetic member 4 has been completed, both of the magnetization of the soft simultaneous rotation magnetic member 4 and the magnetization of the hard simultaneous rotation magnetic member 2 are directed in the same direction. As a result, the magnetic flux emanating from the hard and soft simultaneous rotation magnetic members 4 and 2 is leaked to the superconductor weak link portion 10, as shown in FIG. 11B.

At this timing of Trot in the timing chart of FIG. 10, the control current Irx is turned off, and the relatively small bias pulse Ib is applied to the sense line 6 immediately after a falling of the control current Irx. In response to the turn-off of the control current Irx, the magnetization of the soft simultaneous rotation magnetic member 4 will return to the original direction. However, the reversal of the magnetic member takes a time of several nanoseconds. Therefore, immediately after the turn-off of the control current Irx, the magnetic field Hm (Hm is a value at the weak link portion) emanating from the magnetic member decreases a critical current value Ic in the superconductor weak link portion 10 (FIG. 11C). The critical current value is expressed by Ic(Hm). Here, the device is previously designed so that the critical current value Ic(Hm) in the superconductor weak link portion 10 and the bias current value Ib fulfil the following relation:

$$Ib > Ic(Hm) \tag{2}$$

As a result, the superconductor weak link portion 10 in the selected cell has been brought into a normal conduction condition (definite resistance condition). Therefore, a potential difference is detected between the opposite ends of the sense line 6 (magnetic sense)

After the magnetic sense operation, the bias current pulse Ib is turned off. During a predetermined period of time after the bias current pulse Ib is turned off, namely during a period after the control current Irx is turned off until the control current Iry is turned off in the timing chart of FIG. 10, the strong magnetostatic coupling force between the soft simultaneous rotation magnetic member 4 and the hard simultaneous rotation magnetic member 2 causes the magnetization of the soft simultaneous rotation magnetic member 4 to return to the original condition forming the closed loop of magnetic flux.

In the timing chart of FIG. 10, the cycle time (Tcyc) is set to 80 ns. However, since most of a period of time of 20 ns after the turn-off of the current Iry is an operation margin, the cycle time (Tcyc) can be shortened to some extent. This can be also applied to the case of the stored information of "0", which will be described in the following.

Since the magnetization of the soft simultaneous rotation magnetic member 4 is maintained in the original condition, the magnetic flux emanating from the soft simultaneous rotation magnetic member 4 and the magnetic flux emanating from the hard simultaneous rotation magnetic member 2 cooperate to form a closed loop of magnetic flux. Therefore, when the control current Irx is turned off, the magnetic flux emanating from the hard and soft simultaneous rotation magnetic members 4 and 2 is almost not leaked to the superconductor weak link portion 10, as shown in FIG. 11C.

At the timing Trot in the timing chart of FIG. 10, the control current Irx is turned off, and the relatively small bias pulse Ib is applied to the sense line 6 immediately after a falling of the control current Irx. Here, a critical current value in the superconductor weak link portion 10 under no magnetic field (namely, not modulated by a magnetic field) is expressed by Ic(0). In this connection, the magnetic field Hry in the magnetization hard direction does almost not give any influence to the Josephson junction because of the structure of the memory cell and a Meissner effect. Here, the device is previously designed so that the critical current value Ic(0) in the superconductor weak link portion 10 and the bias current value Ib fulfil the following relation:

$$Ib < Ic(0) \qquad (3)$$

As a result, the superconductor weak link portion 10 in the selected cell is maintained into a superconduction condition (zero resistance condition). Therefore, no potential difference is detected between the opposite ends of the sense line 6 (magnetic sense). After the magnetic sense operation, the bias current pulse Ib is turned off.

Thus, the spin flip in the soft simultaneous rotation magnetic member 4 is utilized for sensing the stored information. On the other hand, the direction of the hard simultaneous rotation magnetic member 4 is maintained in the course of the reading operation. Accordingly, the non-destructive reading can be realized.

Figure 4:
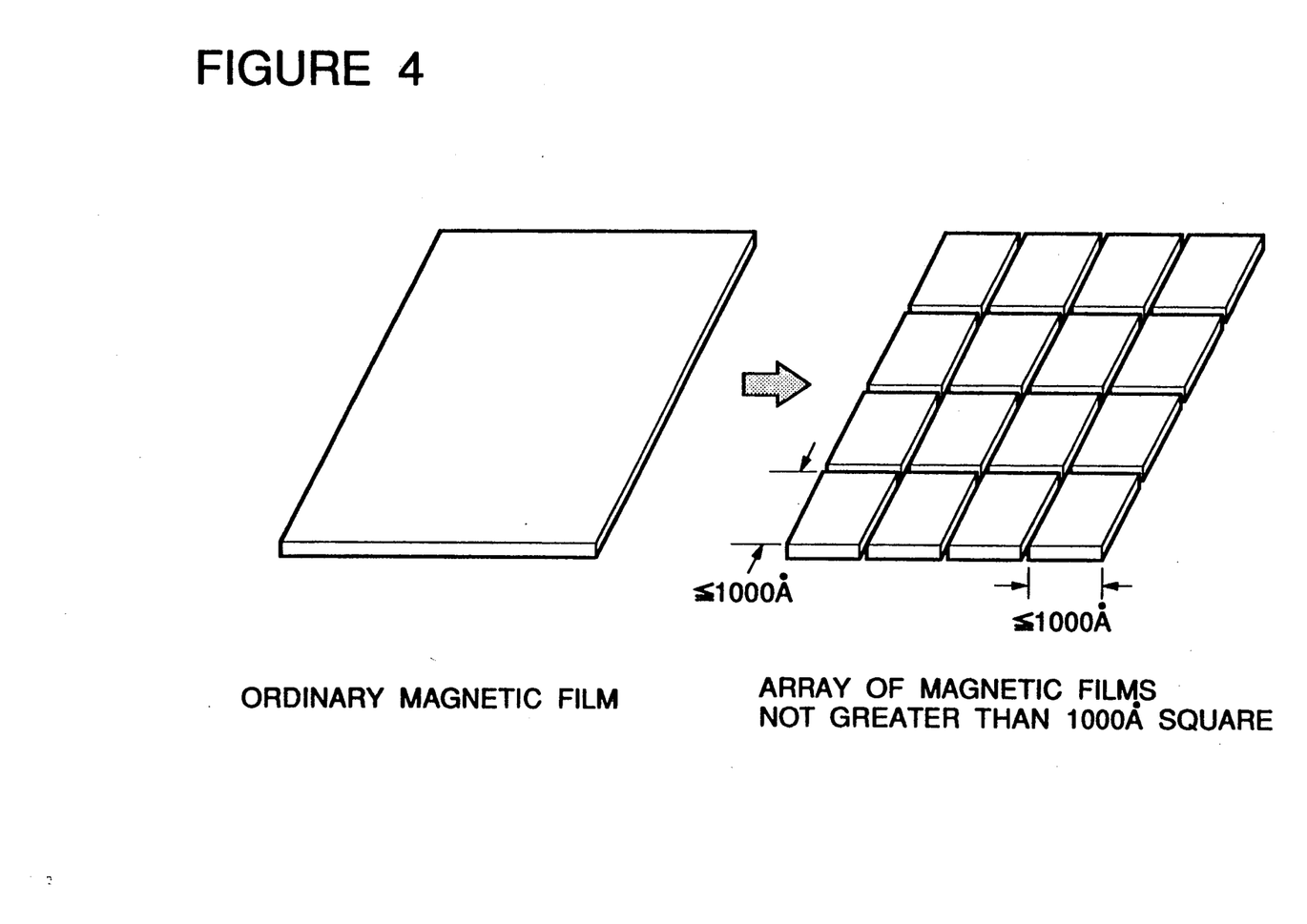
FIG. 4 illustrates an ordinary size magnetic thin film and a collection or array of minute magnetic thin films having a size of 1000 Å or less.

In the above mentioned embodiment, each of the first and second magnetic thin films 2 and 4 is formed of a single magnetic thin film as shown in the left of FIG. 4. However, each of the first and second magnetic thin films 2 and 4 can be formed of a collection or array of very small thin films having a size of not greater than 1000 Å square. With this arrangement, the operating region in which the magnetization reversal mechanism is a spin simultaneous rotation is enlarged, and therefore, the performance of the device can be further improved.

The above mentioned magnetic memory cell in accordance with the present invention can greatly elevate the performance of the magnetic thin film memory. Particularly, the magnetic memory cell in accordance with the present invention is advantageous in the following points:

(1) The access speed (both of writing and reading) can be speeded up to about tens nanoseconds although it is restricted by the magnetization rotation speed of the magnetic member. This speed is compatible to a main memory device.

(2) Since the memory cell has a vertically stacked structure, a proportional reduction rule can be applied. Therefore, the recording density is expected to able to reach 100 Mbits/cm$^2$, which exceeds a semiconductor dynamic random access memory.

(3) A writable/readable non-volatile random access memory can be realized. It is can be read in a non-destructive manner.

(4) A power consumption is very low even at the memory accessing time.

(5) Since a soft error which occurs in a semiconductor IC memory does not occur, a high reliability is expected for a long term.

(6) Because of a combination of the superconductor and the magnetic member, and because of the Josephson SNS junction in place of the Josephson SIS tunnel junction, it is possible to provide a memory device which effectively utilizes various unique advantages of the oxide type high temperature superconductor such as a high Tc (transition temperature) and a short coherence length.

It can be said from the above mentioned advantages that the magnetic memory cell in accordance with the present invention is very suitable to a memory which buffers a memory access gap in a memory layered structure in a main frame (general purpose large scaled computer). In addition, the magnetic memory cell in accordance with the present invention can be used in a writable control storage.

Furthermore, if the problems of the cost and the 77K operation were solved or became negligible, the feature of the non-volatile of the magnetic memory cell in accordance with the present invention will make unnecessary a secondary memory device such as a semiconductor disk and a magnetic hard disk located in peripheral apparatus, excluding a mass storage system. This is very effective in simplifying the layered structure of the memory system. In addition, a full-dress function of a data base machine can be given to a main frame which is now evolving to the data base machine.

The invention has thus been shown and described with reference to the specific embodiments. However, it should be noted that the present invention is in no way limited to the details of the illustrated structures but changes and modifications may be made within the scope of the appended claims.

I claim:

1. A superconductor magnetic memory cell including
an information storage unit of a three-layer structure having two magnetic thin films and a non-magnetic thin film interposed between the two thin films,
an X-direction conductor and a Y-direction conductor intersecting each other at a position of the information storage unit,
a sense conductor located at a side of the X-direction conductor opposite to the Y-direction conductor, the sense conductor being separated from the X-direction conductor and extending to overlap the X-direction conductor,
the two magnetic thin films having an equal saturation magnetic flux amount and an uniaxial magnetic anisotropy in the film plane, and being different from each other in either one of a magnetic anisotropy and a coercive force,
the X-direction conductor, the Y-direction conductor and the sense conductor being formed of a superconductor material, and
the sense conductor having a first superconductor sense line extending from a position above the information storage unit to overlay the X-direction conductor, a non-superconductor layer deposited and patterned to a predetermined shape lying only on a portion above the information storage unit and partially overlaying the first superconductor sense line, and a second superconductor sense line extending from the patterned non-superconductor layer to overlay the X-direction conductor in a direction opposite to an axial direction of the first superconductor sense line, so that above the information storage unit a Josephson junction is formed by the first superconductor sense line, the patterned non-superconductor layer and the second superconductor sense line.

2. A superconductor magnetic memory cell claimed in claim 1 wherein each of the magnetic thin films is formed of a collection or array of magnetic pieces having a size not greater than a thickness of a magnetic domain wall.

3. A superconductor magnetic memory cell claimed in claim 1 wherein the Josephson junction is a superconductor/normal conductor/superconductor Josephson junction.

4. A method of applying a magnetic field for accessing a superconductor magnetic memory cell which includes an information storage unit of a three-layer structure having two magnetic thin films and a nonmagnetic thin film interposed between the two thin films, an X-direction conductor and a Y-direction conductor intersecting each other at a position of the information storage unit, a sense conductor located at a side of the X-direction conductor opposite to the Y-direction conductor, the sense conductor being separated from the X-direction conductor and extending to overlap the X-direction conductor, the two magnetic thin films having an equal saturation magnetic flux amount and an uniaxial magnetic anisotropy in the film plane, but being different from each other in either one of a magnetic anisotropy and a coercive force, the X-direction conductor, the Y-direction conductor and the sense conductor being formed of a superconductor material, and the sense conductor having a Josephson junction positioned above the information storage unit, the method including the step of applying an magnetic field in a magnetization hard direction from a predetermined time before application of a magnetic field in a magnetization ease direction, and maintaining the magnetic field in the magnetization hard direction for a predetermined period of time after a magnetic field in the magnetization ease direction has been erased.

* * * * *